United States Patent
Lee et al.

(10) Patent No.: US 7,560,994 B1
(45) Date of Patent: Jul. 14, 2009

(54) SYSTEMS AND METHODS FOR CASCODE SWITCHING POWER AMPLIFIERS

(75) Inventors: Ockgoo Lee, Atlanta, GA (US); Jeonghu Han, Atlanta, GA (US); Kyu Hwan An, Dunwoody, GA (US); Hyungwook Kim, Atlanta, GA (US); Dong Ho Lee, Atlanta, GA (US); Ki Seok Yang, Atlanta, GA (US); Chang-Ho Lee, Marietta, GA (US); Haksun Kim, Daejeon (KR); Joy Laskar, Marietta, GA (US)

(73) Assignees: Samsung Electro-Mechanics Company (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/968,852

(22) Filed: Jan. 3, 2008

(51) Int. Cl.
    *H03F 3/04* (2006.01)
(52) U.S. Cl. .................................. 330/311; 330/310
(58) Field of Classification Search ............ 330/311, 330/310, 150, 98
    See application file for complete search history.

(56) References Cited

U.S. PATENT DOCUMENTS 6,342,816 B1 * 1/2002 Gradzki .................. 330/311
7,053,718 B2 * 5/2006 Dupuis et al. ............ 330/311
7,215,206 B2 * 5/2007 Dupuis et al. ............ 330/311

OTHER PUBLICATIONS

Lei Wu, et al. "A 900-MHz 29.5-dBm 0.13-μm CMOS HiVP Power Amplifier." IEEE Transactions on Microwave Theory and Techniques. Downloaded Feb. 24, 2009. 6 pages.
Reynaert, Patrick and Michiel Steyaert. "Analysis and Design of the Class E Power Amplifier in CMOS." RF Power Amplifiers for Mobile Communications. Netherlands: Springer, 2006. 87-88.

* cited by examiner

*Primary Examiner*—Henry K Choe
(74) *Attorney, Agent, or Firm*—Sutherland Asbill & Brennan LLP

(57) ABSTRACT

Example embodiments of the invention may provide systems and methods for a power amplifier. The systems and methods may include a first common-source device having a first source, a first gate, a first drain, and a first body, where the first source is connected to the first body, and wherein the first gate is connected to an input port. The systems and methods may further include a second common-gate device having a second source, a second gate, a second drain, and a second body, where the second source is connected to the first drain, where the second source is further connected to the second body, and where the second drain is connected to an output port.

16 Claims, 8 Drawing Sheets

27
SYSTEMS AND METHODS FOR CASCODE SWITCHING POWER AMPLIFIERS

FIELD OF INVENTION

Embodiments of the invention relate generally to cascode power amplifiers.

BACKGROUND OF THE INVENTION

Power amplifiers (PAs) may be utilized in radio front-ends and other wireless devices/applications. Because these PA consume a large amount of power, it may be desirable to utilize a PA with high efficiency. However, designing PAs such as complementary metal oxide semiconductor (CMOS) PAs with high efficiency and high output power is a challenging task. Accordingly, there is a need for high power, high efficiency power amplifiers.

BRIEF SUMMARY OF THE INVENTION

Example embodiments may be directed to a high efficiency power amplifier such as a high efficiency complementary metal oxide semiconductor (CMOS) cascode switching power amplifier. A high efficiency amplifier in accordance with an example embodiment of the invention may include CMOS cascode devices and load networks. According to the example CMOS cascode structure, a body of common-gate device may be tied to the source of common-gate device (BS-cascode). In an OFF state, the amount of leakage current flowing through the common-gate device may be relatively small. Therefore, the BS-cascode structure may minimize the power loss due to leakage current in subthreshold/weak inversion region in the CMOS cascode device. According to an example embodiment of the invention, the BS-cascode structure may be incorporated in a variety of types of switching power amplifiers.

According to an example embodiment of the invention, there is a system for a power amplifier. The system may include a first common-source device having a first source, a first gate, a first drain, and a first body, where the first source is connected to the first body, and where the first gate is connected to an input port, and a second common-gate device having a second source, a second gate, a second drain, and a second body, where the second source is connected to the first drain, where the second source is further connected to the second body, and where the second drain is connected to an output port.

According to another example embodiment of the invention, there is a method for a power amplifier. The method may include providing a first common-source device having a first source, a first gate, a first drain, and a first body, where the first gate is operative as an input port, and providing a second common-gate device having a second source, a second gate, a second drain, and a second body, where the second drain is operative as an output port. The method may further include connecting the first source to the first body, connecting the second source to the second body, and stacking the first common-source device and the second common-gate device by connecting the first drain to the second source.

BRIEF DESCRIPTION OF THE DRAWINGS

Figure 1:
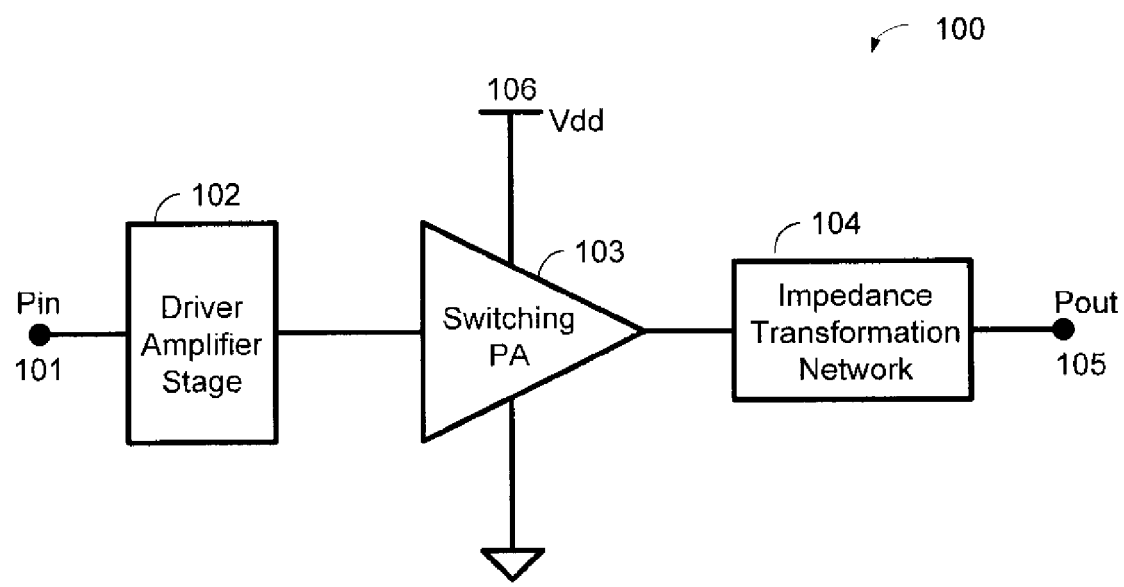

Having thus described the invention in general terms, reference will now be made to the accompanying drawings, which are not necessarily drawn to scale, and wherein:

FIG. 1 is a block diagram for a power transmitter system including a switching power amplifier, according to an example embodiment of the invention.

Figure 2:
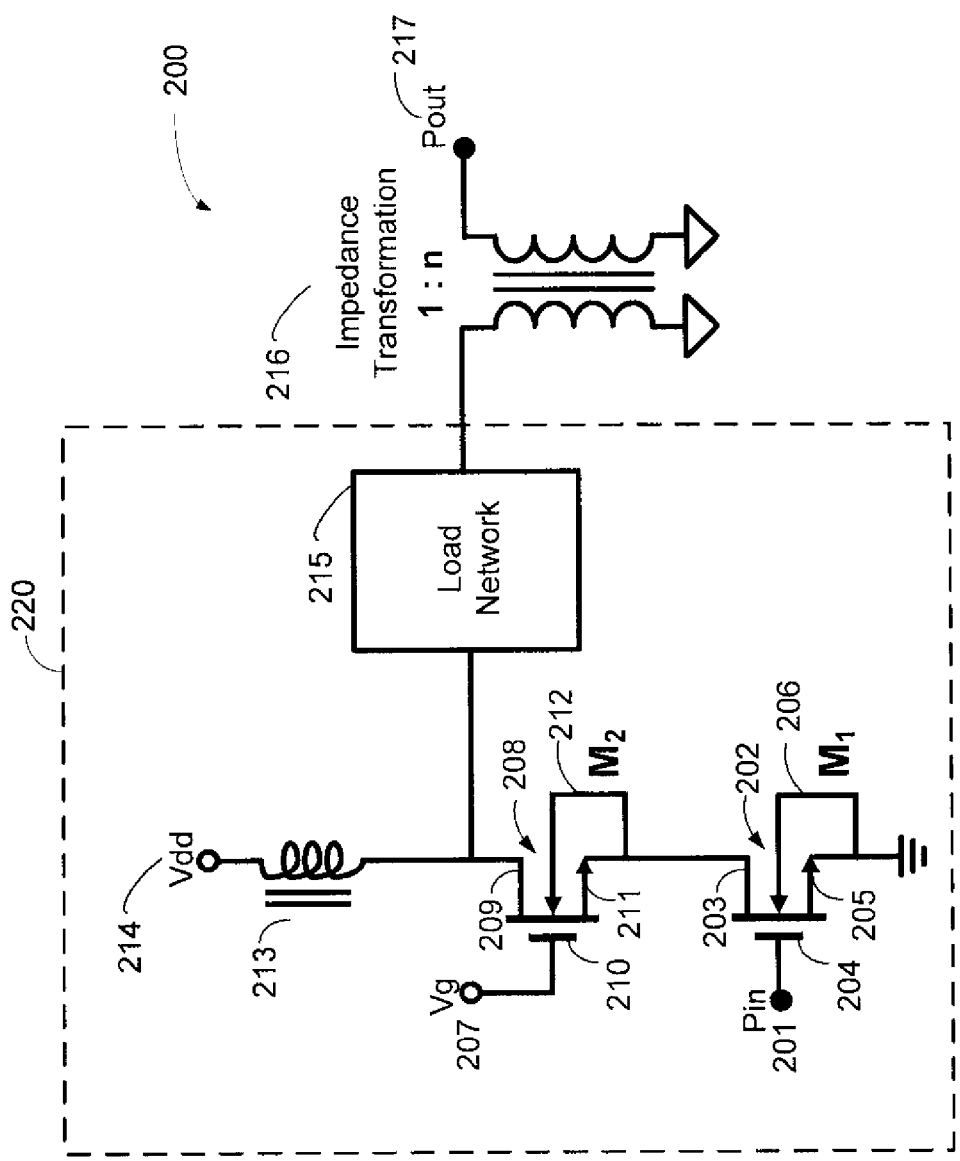

FIG. 2 is a schematic diagram of a BS-CMOS cascode switching power amplifier system with impedance transformation network, according to an example embodiment of the invention.

Figure 3:
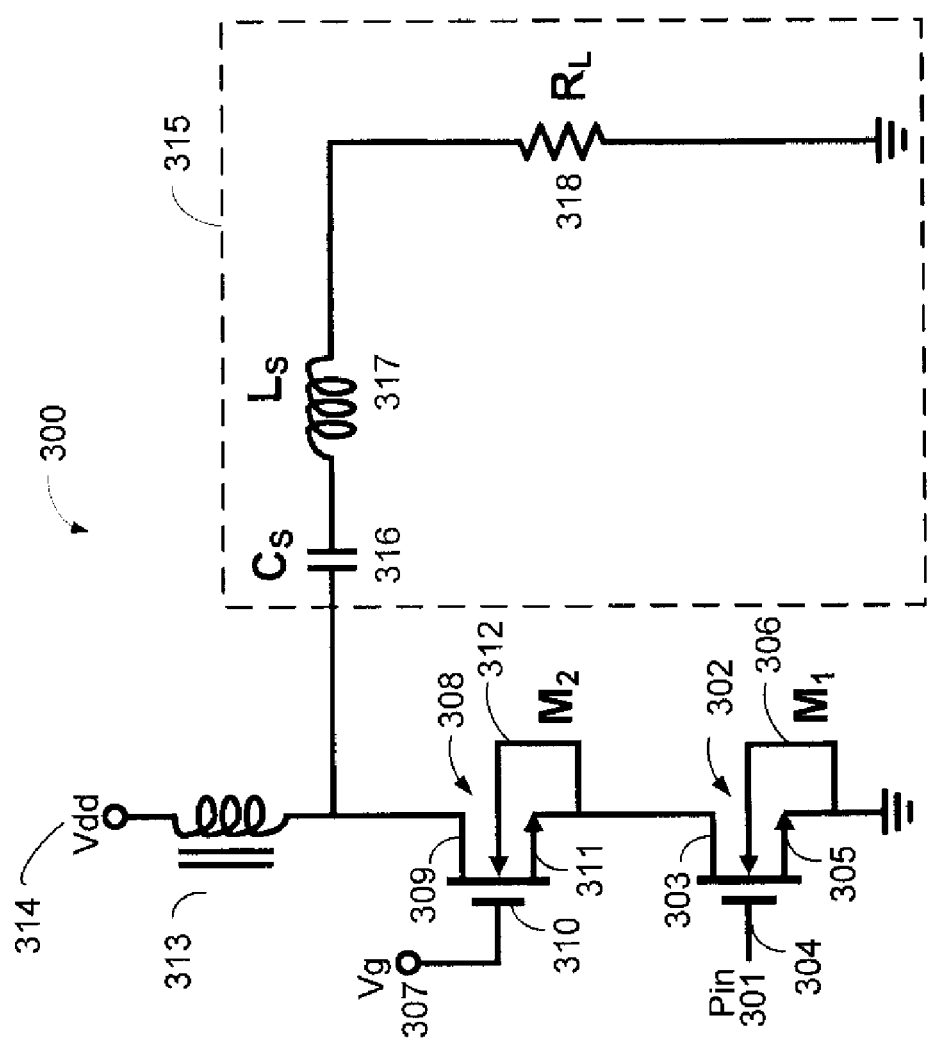

FIG. 3 is a schematic diagram of an example CMOS BS-cascode class-E power amplifier system, according to an example embodiment of the invention.

Figure 4:
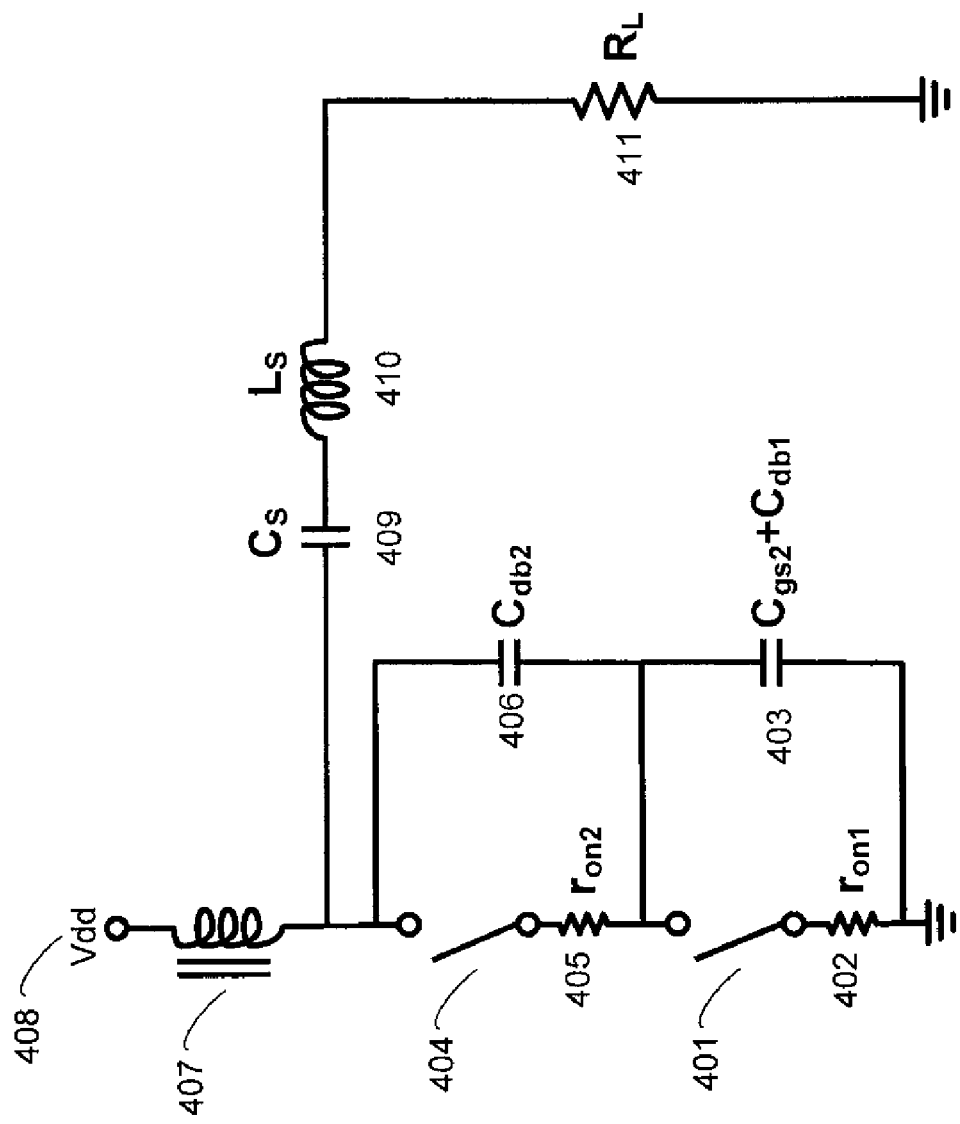

FIG. 4 is an equivalent circuit model of an example CMOS BS-cascode class-E power amplifier system, according to an example embodiment of the invention.

Figure 5:
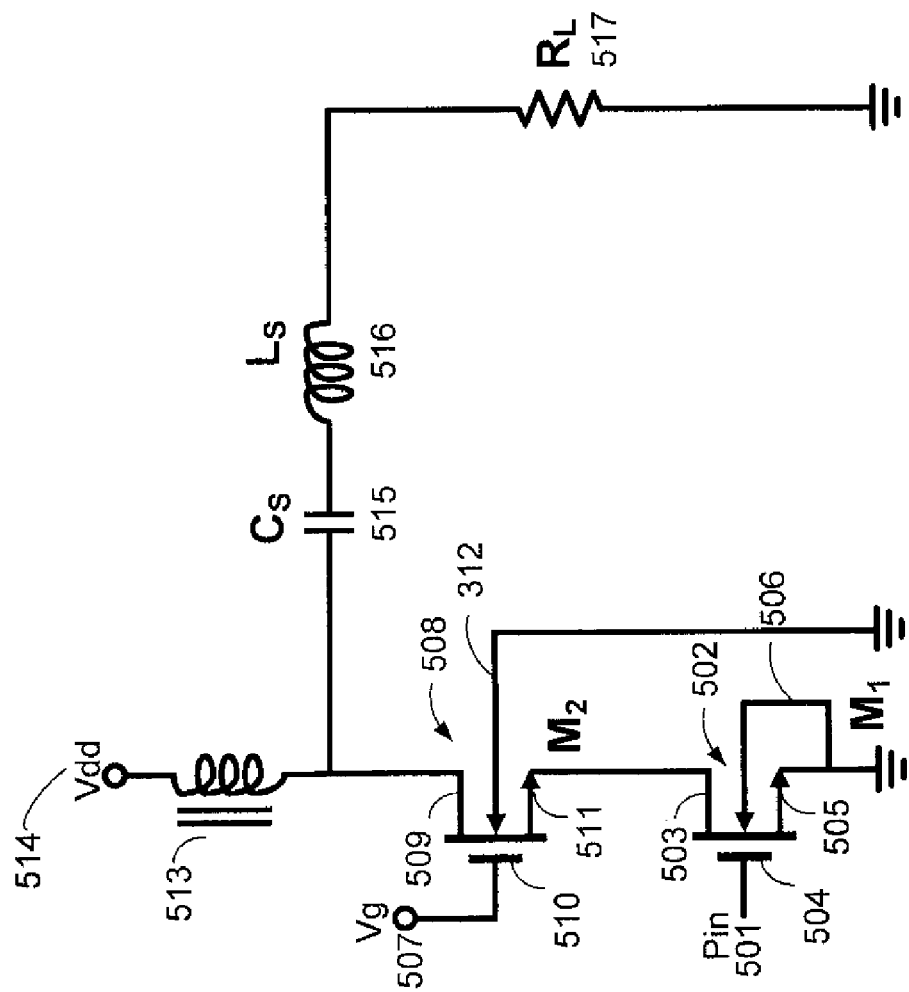

FIG. 5 is a schematic diagram of an example CMOS BG-cascode class-E power amplifier system, according to an example embodiment of the invention.

Figure 6:
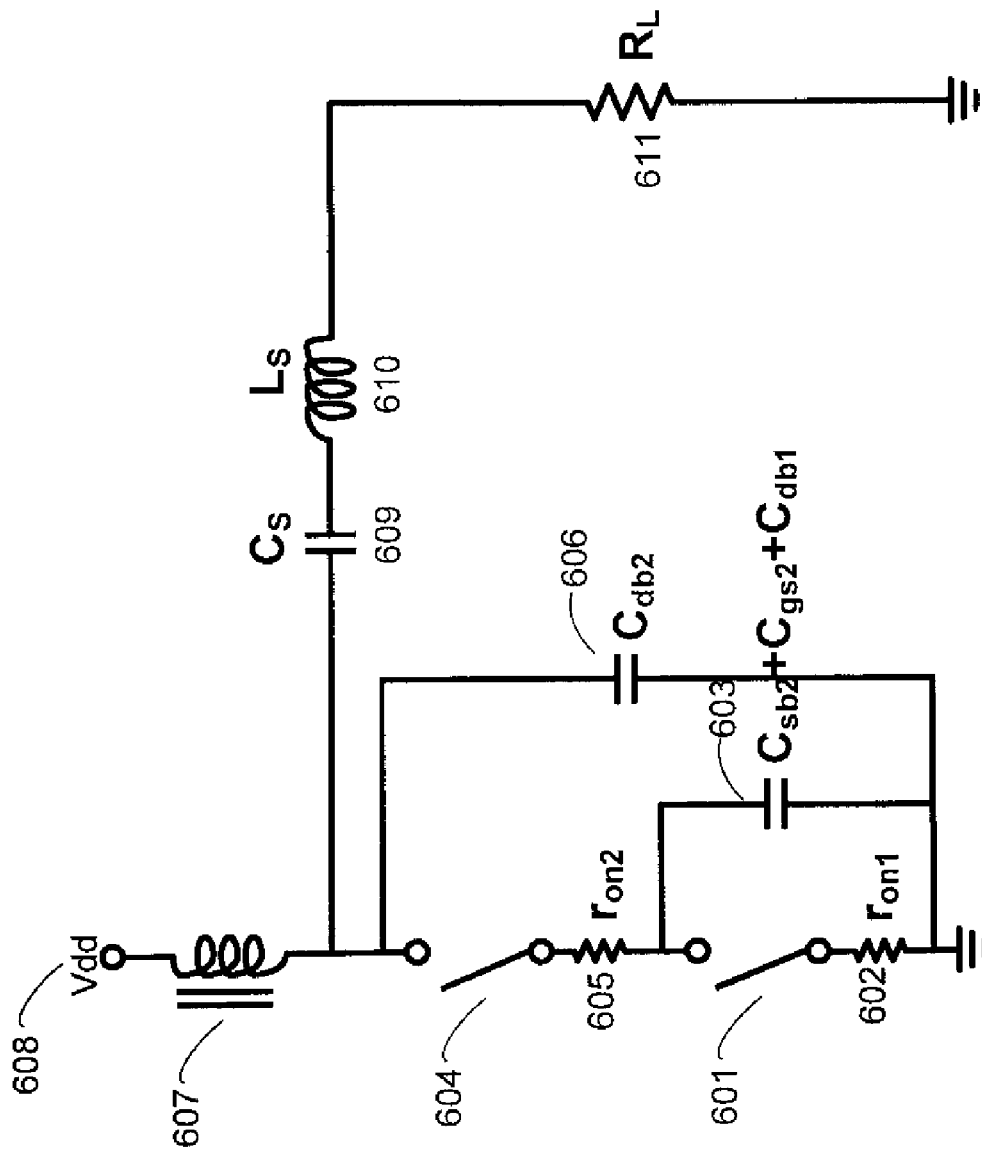

FIG. 6 is an equivalent circuit model of an example CMOS BG-cascode class-E power amplifier system, according to an example embodiment of the invention.

Figure 7:
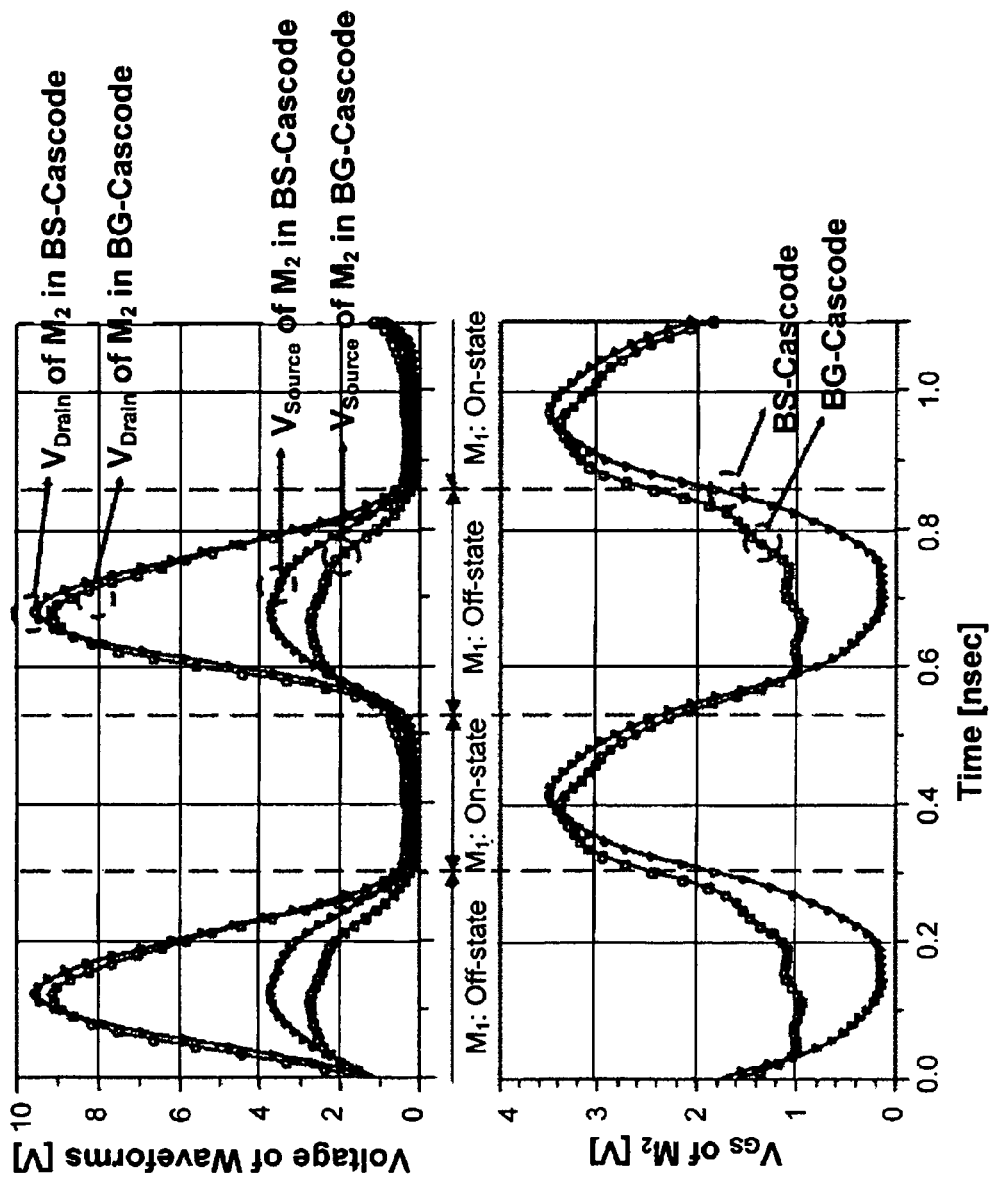

FIG. 7 is the voltage waveforms at the drain and source of the common-gate device and the gate-to-source voltage VGs of the common-gate device, according to an example embodiment of the invention.

Figure 8:
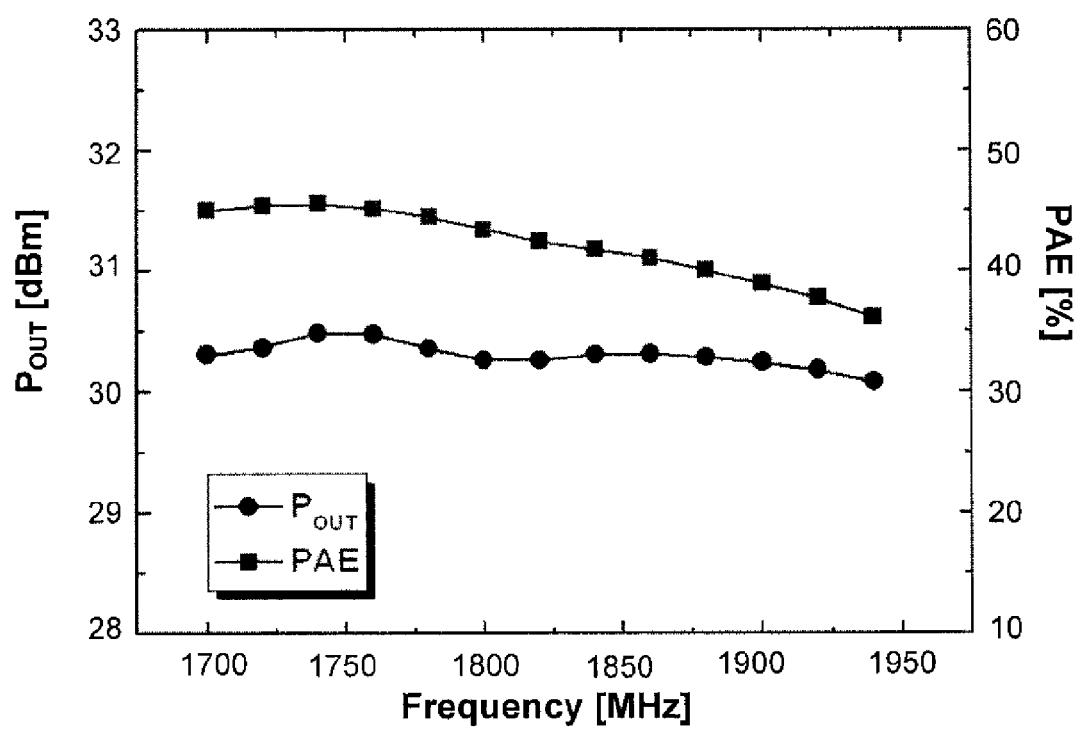

FIG. 8 is a graph of example measurement results of a BS-cascode power amplifier structure in accordance with an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 1 illustrates a switching power amplifier (PA) system 100 that may include an input port 101, an optional driver amplifier stage 102, one or more switching power amplifiers 103, and an optional impedance transformation network 104, according to an example embodiment of the invention. According to an example embodiment of the invention, the driver amplifier stage 102 may receive an input such as a baseband signal or an RF signal from the input port 101, and may generate an output to drive the switching power amplifier 103. As shown in FIG. 1, the switching power amplifier 103 may be powered via a supply voltage port 106 (Vdd). The switching power amplifier 103 may then provide an amplified output signal to the impedance transformation network 104, which matches the output impedance of the power amplifier 103 to a load impedance at the output port 105. According to an example embodiment of the invention, the load may be a switch, a multiplexer, a filter, an antenna, or yet another type of load. According to an example embodiment of the invention, the load impedance may be 50 ohms. Where the load impedance is 50 ohms, the impedance transformation network 104 may transform the output impedance of the switching power amplifier 103 to 50 ohms, according to an example embodiment of the invention.

FIG. 2 illustrates a schematic diagram of a CMOS cascode switching power amplifier system utilizing a BS (body-source) cascode configuration, according to an example embodiment of the invention. As shown in FIG. 2, the power amplifier system 200 may include a BS-cascode switching amplifier 220 that is in communication with and an optional impedance transformation network 216. According to an example embodiment of the invention, the impedance transformation network 216 may be a 1:n transformer that is operative to match the output impedance of the switching power amplifier 220 to the load impedance (e.g., 50 ohms) of the output load 217 (Pout).

Still referring to FIG. 2, the BS-cascode switching amplifier 220 may be a CMOS BS-cascode switching amplifier that includes a first common-source device or transistor 202 ($M_1$) having a first source 205, a first gate 204, a first drain 203, and a first body 206, according to an example embodiment of the invention. Likewise, the CMOS BS-cascode switching amplifier 220 may also include a second common-gate transistor or device 208 ($M_2$) having a second source 211, a second gate 210, a second drain 209, and a second body 212, according to an example embodiment of the invention.

According to an example embodiment of the invention, the first common-source device 202 ($M_1$) may be connected in series with the second common-gate device 208 ($M_2$) to reduce the voltage stress or burden that may otherwise be borne by a single device. According to an example embodiment of the invention, the devices 202 ($M_1$), 208 ($M_2$) may be connected in series by connecting the first drain 203 of the first common-source device 202 ($M_1$) to the second source 211 of the second common-gate device 208 ($M_2$). Additionally, a body-source amplifier configuration may also be applied to the cascode switching amplifier 220 to reduce or minimize leakage current flow in order to increase the efficiency of the amplifier 220. With a body-source amplifier configuration in accordance with an example embodiment of the invention, the first source 205 may be connected to the first body 206 of the first common-source device 202 ($M_1$), and the second source 211 may be connected to the second body 212 of the second common-gate device 208 ($M_2$). Further, the first source 205 of the first common-source device 202 ($M_1$) may be connected to ground (GND) while the second gate 207 of the second common-gate device 208 ($M_2$) may be connected to a gate bias port 207 (Vg). According to an example embodiment of the invention, an input port 201 (Pin) may be provided at the first gate 201 of the first common-source device 202 ($M_1$).

Still referring to FIG. 2, an RF choke 213 may be provided between a power supply 214 (Vdd) and the second drain 209 of the second common-gate device 208 ($M_2$). The RF choke 213 may be operative to feed DC power to the drain 209. According to an example embodiment of the invention, the RF choke 213 may be selected to be large enough such that the current though the second drain 209 may be substantially constant. Additionally, an output port of the cascode switching amplifier 220 may be provided at the second drain 209 of the second common-gate device 208 ($M_2$) and connected to a load network 215. According to an example embodiment of the invention, the load network 215 may be operative to perform a switching operation between the output port and an impedance transformation network 216. The structure of the load network 215 may be dependent on the characteristics (e.g., class-D, E, or F, etc.) of the switching power amplifier 220. For example, Class-D, E, and F switching mode power amplifiers (PAs) may require the load networks to perform their own switching operations. In this case, Class-D PAs may require LCR resonators for their operation. Likewise, Class-E PAs may require one or more LCR branches, and class-F PAs may require several lumped elements to perform harmonic termination. In switching operation, one or more devices may be heavily overdriven, and the load networks acting as switching networks may convert DC energy to RF energy, perhaps at 100% efficiency, according to an example embodiment of the invention.

It will be appreciated that the transistors 202 ($M_1$), 208 ($M_2$) may be metal oxide semiconductor field-effect transistors (MOSFETs), according to an example embodiment of the invention. However, it will be appreciated that other field effect transistors FETs may likewise be utilized without departing from example embodiments of the invention.

FIG. 3 illustrates a circuit diagram of a CMOS BS-cascode class-E power amplifier 300, according to an example embodiment of the invention. As shown in FIG. 3, a BS-cascode amplifier configuration may be implemented using a first common-source transistor or device 302 ($M_1$) and a second common-gate transistor or device 308 ($M_2$), according to an example embodiment of the invention. The first device 302 ($M_1$) may include a first source 305, a first gate 304, a first drain 303, and a first body 306, and the second device 308 ($M_2$) may have a second source 311, a second gate 310, a second drain 309, and a second body 312. According to an example embodiment of the invention, the first device 302 ($M_1$) may in series with the second device 308 ($M_2$) by connecting the first drain 303 to the second source 311. Additionally, the BS-cascode amplifier configuration may be implemented by connecting the first source 305 to the first body 306 as well as the second source 31 to the second body 312.

In FIG. 3, the common-source device 302 ($M_1$) may have its source 305 connected to ground while the common-gate device 308 ($M_2$) may have its gate 310 connected to a gate bias port 307. Furthermore, as shown in FIG. 3, the output port at the second drain of the second device 308 ($M_2$) may be connected to a load network 315. According to an example embodiment of the invention, the load network 315 may be an L-C-R network that may be operative for class-E switching conditions. For example, a class-E load network 315 may comprise a series combination of a capacitive component 316, an inductive component 317, and a resistive component 318. According to an example embodiment of the invention, the components 316, 317, and 318 may be implemented using lumped components.

FIG. 4 illustrates an equivalent circuit model of the BS-cascode power amplifier of FIG. 3, according to an example embodiment of the invention. As shown in FIG. 4, the common-source device 302 ($M_1$) may be represented as a switch 401 having an OFF state and an ON state, according to an example embodiment of the invention. Likewise, the common-gate device 308 ($M_2$) may be represented as a switch 404 having an OFF state and an ON state, according to an example embodiment of the invention. According to an example embodiment of the invention, the ON-state resistance 402 ($r_{on1}$) of common-source device 302 ($M_1$) may be connected in series with the ON-state resistance 405 ($r_{on2}$) of common-gate device 308 ($M_2$). Still referring to FIG. 4, the output capacitance 403 of the common-source device 302 ($M_1$) may be the sum of the drain-to-body capacitance $C_{db1}$ of device 302 ($M_1$) and the gate-to-source capacitance $C_{gs2}$ of device 308 ($M_2$). The output capacitance 403 may be connected in series with the output capacitance 406 of device 308 ($M_2$), which may be the drain-to-body capacitance 406 ($C_{db2}$) of device 308 ($M_2$).

It will be appreciated that in some embodiments it may be desirable to reduce or eliminate the leakage current in the common-gate device 308 ($M_2$) when the BS-cascode amplifier is in the OFF state in order to increase the efficiency of the BS-cascode amplifier. According to an example embodiment of the invention, the leakage current of the common-gate device 308 ($M_2$) may be reduced or eliminated by utilizing the BS-cascode amplifier configuration in accordance with an example embodiment of the invention, which places the source of the common-gate device 308 ($M_2$) at a higher voltage than the gate voltage ($V_G$) less the threshold voltage ($V_{TH2}$) of the common-gate device 308 ($M_2$).

More specifically, with the BS-cascode amplifier configuration, the source to substrate capacitance $C_{sb1}$ of device 302 ($M_1$) may be eliminated since the source of device 302 ($M_1$) may be connected to the body of device 302 ($M_1$). Accordingly, the output capacitance 403 for the common-source device 302 ($M_1$) may be reduced through the elimination of the source to substrate capacitance $C_{sb1}$. In this way, during an OFF state for the BS-cascode amplifier in FIG. 4, AC current flows through the series path defined by the output capacitances 403, 406, and places the source voltage $V_S$ of common gate device 308 ($M_2$) at a higher potential than the gate voltage $V_G$ less the threshold voltage $V_{TH2}$ of device 308 ($M_2$) (e.g., $V_G-V_{TH2}$). Thus, in the OFF state, the leakage current may be eliminated or reduced within the common-gate device 308 ($M_2$). According to an example embodiment of the invention, the elimination or reduction of the leakage current in the common-gate device 308 ($M_2$) may be operative to improve the efficiency of the BS-cascode amplifier.

FIG. 5 illustrates a circuit diagram of the example CMOS body-ground (BG) cascode class-E power amplifier, according to an example embodiment of the invention. In particular, the circuit diagram of FIG. 5 illustrates a BG-cascode amplifier configuration that includes a first common-source device 502 having a first source 505, a first gate 504, a first drain 503, and a first body 506, and a second common-gate device 508 having a second source 511, a second gate 510, a second drain 509, and a second body 512. According to an example embodiment of the invention, the common-source device 502 may be connected in series with the common-gate device 508 by connecting the first drain 503 to the second source 511. According to an example embodiment of the invention, the series connection of the common-source device 502 and the common-gate device 508 may reduce the voltage stress that would otherwise be borne by any one device.

In FIG. 5, the BG-cascode amplifier configuration may include connecting both the first body 506 of the first common-source device 502 and the second body 512 of the common-gate device 508 to ground. According to an example embodiment of the invention, the gate 504 of the common-source device 502 may be connected to an input port 501 (Pin) while the gate 510 of the common-gate device 508 may be connected to a gate bias port 507 (Vg). According to an example embodiment of the invention, the output port of the BG-cascode amplifier may be provided at the second drain 509 of the second common-gate device 508 and connected to a load network. According to an example embodiment of the invention, the load network may be comprised of L-C-R components, including a capacitive component 515 ($C_S$), an inductive component 516 ($L_S$), and a resistive element ($R_L$), that are operative with class-E switching conditions.

FIG. 6 illustrates an equivalent circuit model of BG-cascode class-E power amplifier, according to an example embodiment of the invention. As shown in FIG. 6, the common-source device 502 may be represented as a switch 601 having an OFF state and an ON state, according to an example embodiment of the invention. Likewise, the common-gate device 508 may be represented as a switch 604 having an OFF state and an ON state, according to an example embodiment of the invention. According to an example embodiment of the invention, the ON-state resistance 602 ($r_{on1}$) of common-source device 502 may be connected in series with the ON-state resistance 605 ($r_{on2}$) of common-gate device 508.

Still referring to FIG. 6, the output capacitance 603 of the common-source device 502 may be the sum of drain-to-body capacitance $C_{db1}$ of device 502, the gate-to-source capacitance $C_{gs2}$ of device 508, and the source-to-body capacitance $C_{sb2}$ of device 508. The output capacitance 603 may be separated from the output capacitance 606 of the common-gate device 508, which may be comprised of the drain-to-body capacitance ($C_{db2}$) of device 508, according to an example embodiment of the invention.

According to an example embodiment of the invention, the source voltage of the common-gate device 508 may rise up to $V_G-V_{TH2}$ in an OFF state. Because the large voltage difference between drain and source of device 508, the device 508 may be in the subthreshold/weak inversion region, leakage current may flow, thereby resulting in power loss. Accordingly, to minimize this leakage current, a tuning inductor may be connected to the source of device 508 to increase the source voltage of device 508 and minimize the leakage current. However, the design of the BG-cascode amplifier may require additional space to accommodate the design of the tuning inductor.

SIMULATION AND EXPERIMENTAL RESULTS

FIG. 7 shows the simulated voltage waveforms at the drain and source of a common-gate device and gate-to-source voltage $V_{GS}$ of the common-gate device for both BG-cascode and BS-cascode amplifiers, according to an example embodiment of the invention. Each of the cascode structure has a stack configuration of 0.18-μm common-source and 0.35-μm common-gate, according to an example embodiment of the invention. In the OFF state of a common-source device, the source voltage of the common-gate device in the BS-cascode amplifier may be larger than that for a BG-cascode amplifier. According to an example embodiment of the invention, the source voltage of the common-gate device in the BG-cascode amplifier may increase due to charging output capacitor of common-gate device until the common-gate device goes into subthreshold region. The source voltage may rise to $V_G-V_{TH2}$, according to an example embodiment of the invention. The threshold voltage, $V_{TH}$, of 0.35-um device may be around 1 V when the body is grounded and source is around 2.5 V as shown in FIG. 7. According to an example embodiment of the invention, the gate-to-source voltage $V_{GS}$ of the common-gate device in BG-cascode may be $V_{TH2}$ in OFF state of the common-source device, since voltage variation of the source of the common-gate device may is resulted from the leakage current flowing into large output capacitor of the common-source device and almost same. Though the leakage current is small, the power loss may be large because of large voltage difference between source and drain of the common-gate device. On the other hand, the source voltage of the common-gate device in the BS-cascode may be increased in the OFF state of common-source device, since AC current still flows through series capacitor connection, $C_{db2}$ and $C_{gs2}+C_{db1}$. In an OFF state, due to the current flow, the source voltage of common-gate device $M_2$ may exceed more than $V_G-V_{TH}$, as shown FIG. 7. In an OFF state of the common-source device $M_1$, the gate-to-source voltage $V_{GS}$ of the common-gate device $M_2$ in the BS-cascode may be smaller than one in BG-cascode amplifier so that the subthreshold current of the BS-cascode may likewise be smaller than that in the BG-cascode amplifier. Additionally, the power loss for a BS-cascode amplifier may be minimized without adding an additional inductor, according to an example embodiment of the invention.

Another aspect of a BS-cascode class-E PA may be a small composition of parasitic output capacitance. The output capacitance of the common-source device $M_1$ in BS-cascode may be smaller than that in a BG-cascode, as shown in FIG. 4 and FIG. 6. A small output capacitance can reduce power loss in an OFF state as described herein. Also, small output capacitor of the common-source device $M_1$ may reduce the transition time of the common-gate device $M_2$ from an ON state to an OFF state, and vice versa. Generally, to minimize power loss due to the ON-state resistance $r_{on}$, the device size may need to be increased until the parasitic capacitance seen from the drain of the common-gate device $M_2$ can be incorporated into circuit with the required parallel capacitance for class-E switching condition. Since the effective capacitance from drain of the common-gate device $M_2$ is series connection of $C_{db2}$ and $C_{gs2}+C_{db1}$, the total capacitance in BS-cascode may be smaller than that in BG-cascode. Therefore, a larger device may be used without increasing parasitic capacitance, according to an example embodiment of the invention.

FIG. 8 illustrates example measured results for the operation of an example BS-cascode power amplifier in accordance with an embodiment of the invention. These measurement results illustrate the output power and the power added efficiency of such an example power amplifier. As shown in FIG. 8, the measured results meet the demand of the power amplifier capability in the frequency range between 1700 MHz~1950 MHz. An output power of 30.5 dBm at 1.75 GHz and the corresponding power added efficiency 45% was obtained with a 3.3 V power supply.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system for a power amplifier, comprising:
a first common-source device having a first source, a first gate, a first drain, and a first body, wherein the first source is connected to the first body, and wherein the first gate is connected to an input port;
a second common-gate device having a second source, a second gate, a second drain, and a second body, wherein the second source is connected to the first drain, wherein the second source is further connected to the second body, and wherein the second drain is connected to an output port, wherein the first common-source device provides a first output capacitance defined by the sum of a gate-to-source capacitance of the second common-gate device and a drain-to-body capacitance of the first common-source device, and wherein the second common-gate device provides a second output capacitance defined by a drain-to-body capacitance of the second common-gate device; and
a load network connected to the output port, wherein the load network comprises a series combination of a capacitor, an inductor, and a resistor, wherein the first output capacitance and the second output capacitance are sized to operate with the load network in order to provide a Class-E switching condition.

2. The system of claim 1, further comprising an impedance transformation network, wherein the load network is operable to provide a switching operation between the output port and the impedance transformation network.

3. The system of claim 2, wherein impedance transformation network is connected between the load network and an output load.

4. The system of claim 3, wherein the output load includes a switch, a multiplexer, a filter, or an antenna.

5. The system of claim 1, wherein the input port is operable with a baseband signal or a radio frequency (RF) signal.

6. The system of claim 1, wherein during an OFF state of the first common-source device, AC current flows through the first output capacitance and the second output capacitance, thereby increasing a source voltage at the second source of the second common-gate device.

7. The system of claim 6, wherein the second common-gate device further includes a gate voltage and a threshold voltage, wherein the source voltage is greater than a difference between the gate voltage at the second gate and the threshold voltage of the second common-gate device, thereby minimizing leakage current flow in the power amplifier.

8. A method for a power amplifier, comprising:
providing a first common-source device having a first source, a first gate, a first drain, and a first body, wherein the first gate is operative as an input port;
providing a second common-gate device having a second source, a second gate, a second drain, and a second body, wherein the second drain is operative as an output port, wherein the first common-source device provides a first output capacitance defined by the sum of a gate-to-source capacitance of the second common-gate device and a drain-to-body capacitance of the first common-source device, and wherein the second common-gate device provides a second output capacitance defined by a drain-to-body capacitance of the second common-gate device; and;
connecting the first source to the first body;
connecting the second source to the second body; and
stacking the first common-source device and the second common-gate device by connecting the first drain to the second source; and
connecting a load network to the output port, wherein the load network comprises a series combination of a capacitor, an inductor, and a resistor, wherein the first output capacitance and the second output capacitance are sized to operate with the load network in order to provide a Class-E switching condition.

9. The method of claim 8, wherein the load network is operable to provide a switching operation between the output port and an impedance transformation network.

10. The method of claim 9, further comprising connecting the impedance transformation network between the load network and an output load.

11. The method of claim 10, wherein the output load includes a switch, a multiplexer, a filter, or an antenna.

12. The method of claim 8, wherein the input port is operable with a baseband signal or a radio frequency (RF) signal.

13. The method of claim 8, wherein during an OFF state of the first common-source device, AC current flows through the first output capacitance and the second output capacitance, thereby increasing a source voltage at the second source of the second common-gate device.

14. The method of claim 13, wherein second common-gate device further includes a gate voltage at the second gate and a threshold voltage for the second common-gate device, wherein the source voltage is greater than a difference between the gate voltage and the threshold voltage, thereby minimizing leakage current flow in the power amplifier.

15. The system of claim 1, wherein the first source is further connected to ground, and wherein to provide the Class-E switching condition, the first output capacitance and the second output capacitance are of the appropriate size such that no external capacitor is needed between the output port and ground.

16. The method of claim 8, wherein the first source is further connected to ground, and wherein to provide the Class-E switching condition, the first output capacitance and the second output capacitance are of the appropriate size such that no external capacitor is needed between the output port and ground.

* * * * *